(12) United States Patent
Qian et al.

(10) Patent No.: US 11,852,542 B2
(45) Date of Patent: Dec. 26, 2023

(54) METHODS FOR MEASURING TEMPERATURE OF WAFER CHUCK AND CALIBRATING TEMPERATURE AND SYSTEM FOR MEASURING TEMPERATURE

(71) Applicant: CHANGXIN MEMORY TECHNOLOGIES, INC., Hefei (CN)

(72) Inventors: Shibing Qian, Hefei (CN); ShihChieh Lin, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 244 days.

(21) Appl. No.: 17/376,584

(22) Filed: Jul. 15, 2021

(65) Prior Publication Data
US 2021/0341342 A1 Nov. 4, 2021

Related U.S. Application Data

(63) Continuation of application No. PCT/CN2021/080389, filed on Mar. 12, 2021.

(30) Foreign Application Priority Data

Mar. 19, 2020 (CN) .......................... 202010196028.2

(51) Int. Cl.
G01K 7/00 (2006.01)
G01K 15/00 (2006.01)
(Continued)

(52) U.S. Cl.
CPC ........... G01K 15/002 (2013.01); G01K 1/026 (2013.01); G01K 7/16 (2013.01); H01L 22/12 (2013.01); H01L 22/14 (2013.01); G01K 3/06 (2013.01)

(58) Field of Classification Search
CPC ........ G01K 15/002; G01K 1/026; G01K 7/16; H01L 22/12; H01L 22/14
(Continued)

(56) References Cited

U.S. PATENT DOCUMENTS 5,001,423 A * 3/1991 Abrami .............. G01R 31/2831
219/448.12
5,435,646 A 7/1995 McArthur
(Continued)

FOREIGN PATENT DOCUMENTS

CN  101677242 A  3/2010
CN    1956146 B  8/2011
(Continued)

OTHER PUBLICATIONS

International Search Report in the international application No. PCT/CN2021/080389, dated May 8, 2021, 3 pgs.
(Continued)

Primary Examiner — Gail Kaplan Verbitsky
(74) Attorney, Agent, or Firm — Cooper Legal Group, LLC

(57) ABSTRACT

Methods for measuring a temperature of a wafer chuck and calibrating temperature and a temperature measuring system are provided. The measuring method includes: placing a test wafer on a wafer chuck, where a plurality of semiconductor devices having electrical parameters varying as a function of temperature are formed on the test wafer; making the temperature of the wafer chuck reach set temperatures; measuring the semiconductor devices respectively to obtain electrical parameters corresponding to the semiconductor devices; obtaining actual temperatures of the semiconductor devices according to the electrical parameters and variations, of the electrical parameters, as the function of temperature; and obtaining an actual temperature distribution of
(Continued)

the wafer chuck according to the actual temperatures of the semiconductor devices.

17 Claims, 5 Drawing Sheets

(51) Int. Cl.
    *G01K 1/02*     (2021.01)
    *G01K 7/16*     (2006.01)
    *H01L 21/66*     (2006.01)
    *G01K 3/06*     (2006.01)

(58) Field of Classification Search
    USPC .......................................................... 702/99
    See application file for complete search history.

(56) References Cited

U.S. PATENT DOCUMENTS

| | | | | |
|---|---|---|---|---|
| 5,436,494 | A | * | 7/1995 | Moslehi ................ G01K 7/00 |
| | | | | 257/467 |
| 6,545,494 | B1 | * | 4/2003 | Olsen ................ G05D 23/1934 |
| | | | | 324/750.08 |
| 7,492,176 | B2 | | 2/2009 | Chiba |
| 8,289,040 | B2 | * | 10/2012 | Komoto ............ G01R 31/2874 |
| | | | | 324/756.01 |
| 10,366,867 | B2 | | 7/2019 | Criminale et al. |
| 10,872,747 | B2 | | 12/2020 | Linebarger, Jr. et al. |
| 2002/0101906 | A1 | * | 8/2002 | Braun ................... G01K 15/00 |
| | | | | 374/178 |
| 2006/0114012 | A1 | * | 6/2006 | Reitinger .......... G01R 31/2874 |
| | | | | 324/750.08 |
| 2007/0075797 | A1 | | 4/2007 | Matsuya |
| 2009/0172616 | A1 | * | 7/2009 | Lapanik .................. H01L 22/12 |
| | | | | 716/106 |
| 2010/0066433 | A1 | | 3/2010 | Mochizuki |
| 2012/0051392 | A1 | * | 3/2012 | Grillberger ........... H01L 23/345 |
| | | | | 374/57 |
| 2018/0053636 | A1 | | 2/2018 | Criminale et al. |
| 2019/0295824 | A1 | | 9/2019 | Criminale et al. |
| 2019/0331535 | A1 | | 10/2019 | Zhuang |
| 2020/0051789 | A1 | | 2/2020 | Linebarger, Jr. et al. |
| 2022/0319884 | A1 | * | 10/2022 | Lin .......................... G01K 7/00 |

FOREIGN PATENT DOCUMENTS

| | | | | |
|---|---|---|---|---|
| CN | 101568813 | B | * 12/2011 | ................ G01J 1/04 |
| CN | 103050423 | A | 4/2013 | |
| CN | 103280413 | A | 9/2013 | |
| CN | 103808425 | A | 5/2014 | |
| CN | 104051298 | A | 9/2014 | |
| CN | 105097421 | A | 11/2015 | |
| CN | 106501699 | A | 3/2017 | |
| CN | 106505018 | A | 3/2017 | |
| CN | 106771942 | A | 5/2017 | |
| CN | 106840439 | A | 6/2017 | |
| CN | 107091697 | A | 8/2017 | |
| CN | 107331595 | A | 11/2017 | |
| CN | 108803260 | A | 11/2018 | |
| CN | 109084911 | A | 12/2018 | |
| CN | 109186790 | A | 1/2019 | |
| CN | 109540961 | A | 3/2019 | |
| CN | 109643668 | A | 4/2019 | |
| CN | 109659244 | A | 4/2019 | |
| CN | 110085531 | A | 8/2019 | |
| CN | 110274705 | A | 9/2019 | |
| CN | 110600419 | A | 12/2019 | |
| CN | 110888470 | A | 3/2020 | |
| JP | 58060532 | A | * 4/1983 | ............. C23C 16/46 |
| JP | 2002016117 | A | * 1/2002 | |
| JP | 3563224 | B2 | * 9/2004 | ........... H01L 21/324 |
| JP | 2004286593 | A | * 10/2004 | |
| JP | 2007208249 | A | * 8/2007 | ............. G01D 9/005 |
| JP | 2004531067 | A | * 4/2010 | |
| JP | 2012256799 | A | 12/2012 | |
| JP | 2013008746 | A | * 1/2013 | |
| JP | 2014190801 | A | 10/2014 | |
| KR | 20170073352 | A | * 6/2017 | |
| TW | 421832 | B | 2/2001 | |
| TW | 440685 | B | 6/2001 | |
| TW | M528516 | U | 9/2016 | |
| WO | WO-0068979 | A2 | * 11/2000 | ............. G01K 1/026 |
| WO | WO-0136916 | A2 | * 5/2001 | ............. G01K 11/12 |
| WO | WO-0205051 | A2 | * 1/2002 | ......... G05D 23/1934 |
| WO | WO-2005109474 | A1 | * 11/2005 | ....... H01L 21/67253 |
| WO | WO-2008118780 | A1 | * 10/2008 | ............. F04D 17/04 |
| WO | 2018086666 | A1 | 5/2018 | |
| WO | 2020033304 | A1 | 2/2020 | |

OTHER PUBLICATIONS

"Conversion from Nonlinear Thermistors to Linear Temperature Sensors", Oct. 2016, Lu Shi Haochen, (Science and Technology), vol. 28, No. 31, pp. 71-73.

"Wafer Temperature Monitoring Technology in Integrated Circuit Manufacturing Process", Jan. 2021, Jia Jingcai, Zhong Yekui, Zhang Zezhan, Jiang Jing and Wang Chao, Chinese Journal of Scientific Instrument, vol. 42, No. 1, pp. 15-29.

First Office Action of the Chinese application No. 202010196028.2, dated Feb. 14, 2022, 17 pgs.

International Search Report in the international application No. PCT/CN2021/080352, dated Jun. 23, 2021, 2 pgs.

International Search Report in the international application No. PCT/CN2021/079968, datd May 27, 2021, 2 pgs.

International Search Report in the international application No. PCT/CN2021/079969, dated Jun. 10, 2021, 2 pgs.

* cited by examiner

METHODS FOR MEASURING TEMPERATURE OF WAFER CHUCK AND CALIBRATING TEMPERATURE AND SYSTEM FOR MEASURING TEMPERATURE

CROSS-REFERENCE TO RELATED DISCLOSURE

The present application is a U.S. continuation application of International Application No. PCT/CN 2021/080389 filed on Mar. 12, 2021, which claims priority to Chinese Patent Application No. 202010196028.2, filed on Mar. 19, 2020, entitled "METHODS FOR MEASURING TEMPERATURE OF WAFER CHUCK AND CALIBRATING TEMPERATURE AND SYSTEM FOR MEASURING TEMPERATURE". The contents of the above applications are hereby incorporated by reference in their entirety.

TECHNICAL FIELD

The present disclosure relates to the technical field of semiconductors, and particularly, to methods for measuring a temperature of a wafer chuck and calibrating a temperature and a system for measuring a temperature.

BACKGROUND

The temperature of a wafer chuck in a process chamber of a semiconductor device is typically measured by placing a temperature calibrator at each position on a device stage and the temperature of the process chamber is calibrated by using the temperature calibrators to ensure that the temperature at each position on the stage is consistent. However, the method has some disadvantages.

SUMMARY

In an aspect of the present disclosure, a method for measuring a temperature of a wafer chuck is provided. The method includes the following operations.

A heat source is provided. The wafer chuck is disposed on the heat source, a test wafer is placed on the wafer chuck, and a plurality of semiconductor devices having electrical parameters varying as a function of temperature are formed on the test wafer.

The heat source is controlled to make the temperature of the wafer chuck reach set temperatures.

The semiconductor devices are measured respectively to obtain electrical parameters corresponding to the semiconductor devices.

Actual temperatures of the semiconductor devices are obtained according to the electrical parameters and variations, of the electrical parameters, as the function of temperature.

An actual temperature distribution of the wafer chuck is obtained according to the actual temperatures of the semiconductor devices.

The set temperatures are greater than or equal to a minimum critical temperature endurable by the semiconductor devices and smaller than or equal to a maximum critical temperature endurable by the semiconductor devices.

In another aspect of the present disclosure, a method for calibrating a temperature of a wafer chuck is provided. The method includes operations for measuring the temperature of the wafer chuck. The temperature of the wafer chuck is measured by using the above method for measuring the temperature of the wafer chuck. The method for calibrating the temperature further includes the following operation.

A heat source is adjusted according to an actual temperature distribution of the wafer chuck, so that when the temperature of the wafer chuck reaches set temperatures, actual temperatures of semiconductor devices tend to the set temperatures.

In another aspect of the present disclosure, a temperature measuring system for measuring a temperature of a wafer chuck is provided. The temperature measuring system includes a heating module, a setting module, a measuring module and a calculating module.

The heating module is configured to heat the wafer chuck to set temperatures. A test wafer is placed on the wafer chuck, and a plurality of semiconductor devices having electrical parameters varying as a function of temperature are formed on the test wafer.

The setting module is configured to set the set temperatures of the wafer chuck.

The measuring module is configured to measure the semiconductor devices on the test wafer respectively to obtain electrical parameters of the semiconductor devices.

The calculating module is configured to obtain variations, of the electrical parameters, as the function of temperature and electrical parameters of the semiconductor devices corresponding to the set temperatures, calculate to obtain actual temperatures of the semiconductor devices corresponding to the set temperatures, and obtain an actual temperature distribution of the wafer chuck according to the actual temperatures of the semiconductor devices.

The set temperatures are greater than or equal to a minimum critical temperature endurable by the semiconductor devices and smaller than or equal to a maximum critical temperature endurable by the semiconductor devices.

The details of one or more embodiments of the present disclosure are set forth in the accompanying drawings and the description below. Other features, objects, and advantages of the present disclosure will be apparent according to the specification, the accompanying drawings, and the claims.

BRIEF DESCRIPTION OF THE DRAWINGS

For a better description and illustration of the embodiments of the present disclosure, reference may be made to one or more of the accompanying drawings, but the additional details or examples used to describe the accompanying drawings should not be construed as limiting the scope of any one of the present disclosure, presently described embodiments, or preferred manners of the present disclosure.

DETAILED DESCRIPTION

Figure 1:
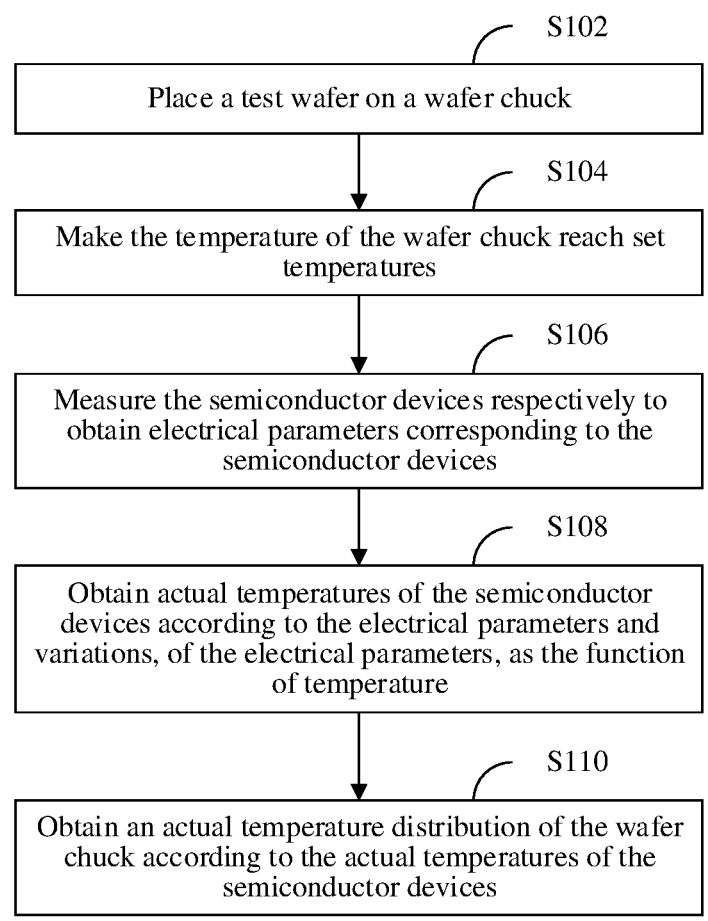
FIG. 1 is a flowchart of a method for measuring a temperature of a wafer chuck according to an embodiment.

For ease of understanding of the present disclosure, the present disclosure will now be described more fully hereinafter with reference to the related accompanying drawings. Preferred embodiments of the present disclosure are illustrated in the accompanying drawings. The present disclosure may, however, be implemented in many different forms, which should not be limited to the embodiments described herein. Rather, these embodiments are provided so that the disclosed content of the present disclosure will be more thorough and complete.

Unless defined otherwise, all technical and scientific terms used herein have the same meaning as commonly understood by those skilled in the art to which the present disclosure belongs. The terms used herein in the specification of the present disclosure are for the purpose of describing particular embodiments only and are not intended to be limiting of the present disclosure. As used herein, the term "and/or" includes any and all combinations of one or more of the associated listed items.

It should be understood that when an element or layer is referred to as being "on", "adjacent to", "connected to", or "coupled to" another element or layer, the element or layer may be directly on, adjacent to, connected to, or coupled to the other element or layer, or intervening elements or layers may be present. In contrast, when an element is referred to as being "directly on", "directly adjacent to", "directly connected to", or "directly coupled to" another element or layer, there are no intervening elements or layers present. It should be understood that although the terms first, second, third, etc. may be used to describe various elements, components, regions, layers, and/or portions, these elements, components, regions, layers, and/or portions should not be limited by these terms. These terms are used merely to distinguish one element, component, region, layer, or portion from another element, component, region, layer, or portion. Therefore, a first element, component, region, layer, or portion discussed below may be represented as a second element, component, region, layer, or portion without departing from the teachings of the present disclosure.

Spatially relational terms such as "below", "under", "lower", "beneath", "above", and "upper" may be used herein for convenience of description to describe a relationship between one element or feature and another element or feature illustrated in the figures. It should be understood that in addition to the orientation shown in the figures, the spatially relational terms are intended to further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. The device may be otherwise oriented (rotated by 90 degrees or in other orientations) and the spatial descriptors used herein may be interpreted accordingly.

The terms used herein are for the purpose of describing particular embodiments only and are not intended to be limiting of the present disclosure. As used herein, the singular forms "a/an", "one", and "the" are also intended to include the plural forms as well, unless the context clearly dictates otherwise. It should also be understood that when the terms "composed of" and/or "including" are used in this specification, the presence of the features, integers, steps, operations, elements, and/or components is determined, but the presence or addition of one or more other features, integers, steps, operations, elements, components, and/or groups is also possible. As used herein, the term "and/or" includes any and all combinations of the associated listed items.

The applicant has known that the temperature of a wafer chuck in a process chamber of a semiconductor device is measured by placing a temperature calibrator at each position on a device stage and the temperature of the process chamber is calibrated by using the temperature calibrators to ensure that the temperature at each position on the stage is consistent. However, the method has the following disadvantages. 1. Limited by the number of sensors placed on the stage, the temperature distribution on the stage cannot be measured. 2. Due to the surrounding environment, air is filled between the sensors, wafer is between test points on the wafer, and the temperature detected by the sensors on the stage has a certain deviation from actual temperature of the wafer placed on the stage. 3. The temperatures are changed manually, the waiting time is long, an inspector needs to measure the temperatures slowly one by one, the measuring period is long, and the labor cost is high.

As shown in FIG. 1, in one embodiment, a method for measuring a temperature of a wafer chuck is provided. The method includes the following operations.

At S102, a test wafer is placed on a wafer chuck.

A heat source is provided. The wafer chuck is disposed on the heat source. The test wafer is placed on the wafer chuck. A plurality of semiconductor devices having electrical parameters varying as a function of temperature are formed on the test wafer.

In one embodiment, the semiconductor devices on the test wafer include at least one type of the following: a bipolar junction transistor device, a resistor device, and a field effect transistor device.

In one embodiment, each of the semiconductor devices includes one or more electrical parameters that varies as a function of temperature within a temperature range (e.g., $-150°$ C. to $150°$ C., $-100°$ C. to $100°$ C.), such as a resistance parameter and a voltage parameter.

In one embodiment, the size of the wafer chuck is related to the size of a wafer carried by the wafer chuck. For example, the wafer chuck is a wafer chuck carrying an 8-inch wafer or a wafer chuck carrying a 12-inch wafer.

At S104, the temperature of the wafer chuck is made to reach set temperatures.

By controlling the heat source, the temperature of the wafer chuck reaches any set temperature which is greater than or equal to a minimum critical temperature endurable by the semiconductor devices and smaller than or equal to a maximum critical temperature endurable by the semiconductor devices, such as $-40°$ C., $-20°$ C., $0°$ C., $10°$ C., $25°$ C., $50°$ C., $85°$ C., $100°$ C., $125°$ C., and $150°$ C., etc.

At S106, the semiconductor devices are measured respectively to obtain electrical parameters corresponding to the semiconductor devices.

When the temperature of the wafer chuck reaches the set temperatures, the semiconductor devices are measured respectively to obtain electrical parameters corresponding to the semiconductor devices.

At S108, actual temperatures of the semiconductor devices are obtained according to the electrical parameters and variations, of the electrical parameters, as the function of temperature.

Actual temperatures of the semiconductor devices, i.e. measurement temperatures of the semiconductor devices, are obtained through the electrical parameters obtained by measuring the semiconductor devices respectively and the variations, of the electrical parameters, as the function of temperature.

At S110, an actual temperature distribution of the wafer chuck is obtained according to the actual temperatures of the semiconductor devices.

The actual temperatures of the semiconductor devices located on the wafer chuck are the same as the actual temperature of the wafer chuck below. The actual temperature distribution of the wafer chuck, i.e. an actual temperature distribution of the wafer chuck when the temperature of the wafer chuck reaches the set temperatures may be obtained according to the actual temperatures of the semiconductor devices.

Figure 2:
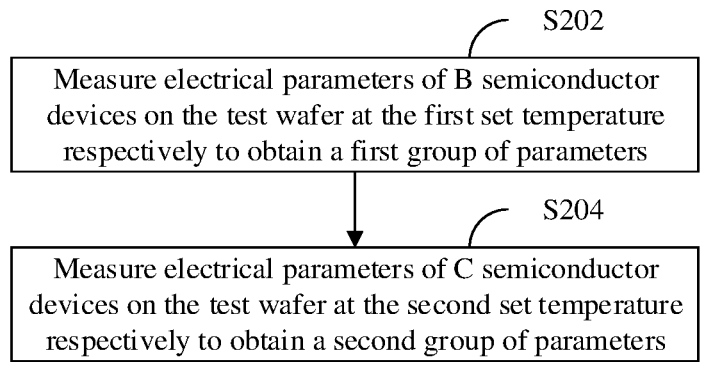
FIG. 2 is a flowchart of measuring the semiconductor devices respectively to obtain electrical parameters corresponding to the semiconductor devices according to an embodiment.

In one embodiment, the set temperatures include a first set temperature and a second set temperature. The test wafer is provided with A semiconductor devices. A is an integer greater than or equal to 2. As shown in FIG. 2, step S106 includes the following operations.

At S202, electrical parameters of B semiconductor devices on the test wafer at the first set temperature are measured respectively to obtain a first group of parameters.

After the temperature of the wafer chuck reaches the first set temperature, B semiconductor devices greater than or equal to 2 and smaller than or equal to A in quantity are selected from the A semiconductor devices on the test wafer, and electrical parameters of the B semiconductor devices are measured respectively to obtain the first group of parameters composed of the electrical parameters of the B semiconductor devices.

At S204, electrical parameters of C semiconductor devices on the test wafer at the second set temperature are measured respectively to obtain a second group of parameters.

After the temperature of the wafer chuck reaches the second set temperature, C semiconductor devices greater than or equal to 2 and smaller than or equal to A in quantity are selected from the A semiconductor devices on the test wafer, and electrical parameters of the C semiconductor devices are measured respectively to obtain the second group of parameters composed of the electrical parameters of the C semiconductor devices.

In one embodiment, the C semiconductor devices include at least one semiconductor device belonging to the B semiconductor devices.

In one embodiment, the C semiconductor devices are composed of a group of semiconductor devices, different from the B semiconductor devices, on the test wafer.

Figure 3:
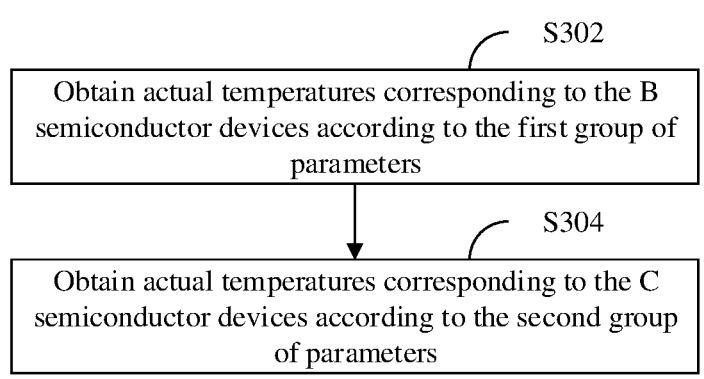
FIG. 3 is a flowchart of obtaining actual temperatures of the semiconductor devices according to the electrical parameters and variations, of the electrical parameters, as the function of temperature according to an embodiment.

As shown in FIG. 3, step S108 includes the following operations.

At S302, actual temperatures corresponding to the B semiconductor devices are obtained according to the first group of parameters.

Actual temperatures of the B semiconductor devices are obtained respectively according to the first group of parameters and the variations, of the electrical parameters, as the function of temperature.

At S304, actual temperatures corresponding to the C semiconductor devices are obtained according to the second group of parameters.

Actual temperatures of the C semiconductor devices are obtained respectively according to the second group of parameters and the variations, of the electrical parameters, as the function of temperature.

Figure 4:
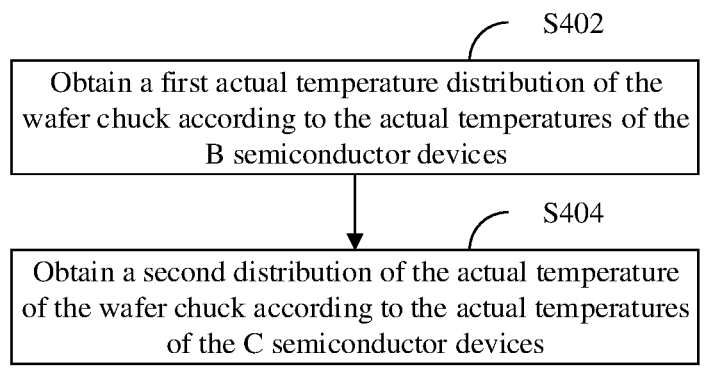
FIG. 4 is a flowchart of obtaining an actual temperature distribution of the wafer chuck according to the actual temperatures of the semiconductor devices according to an embodiment.

As shown in FIG. 4, step S110 includes the following operations.

At S402, a first actual temperature distribution of the wafer chuck is obtained according to the actual temperatures of the B semiconductor devices.

Figure 5:
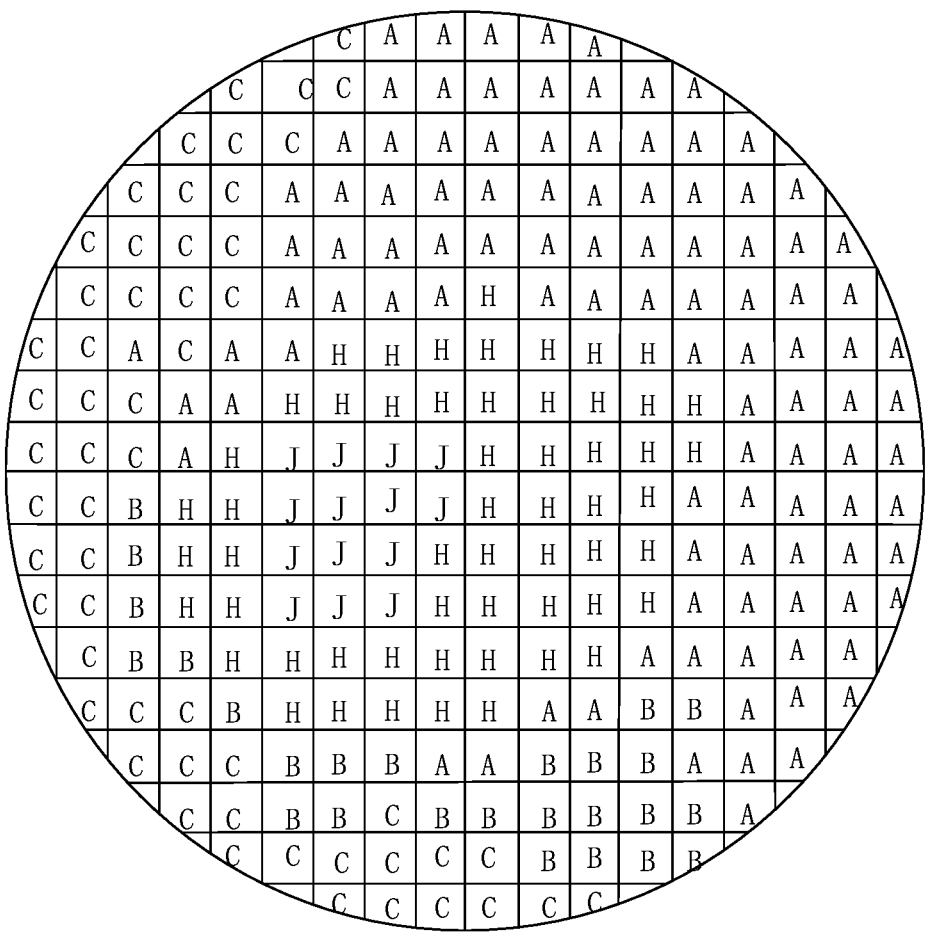
FIG. 5 shows a first actual temperature distribution of a wafer chuck when the temperature of the wafer chuck reaches a first set temperature according to an embodiment.

Since the semiconductor devices on the wafer chuck are in direct contact with the wafer chuck below, the temperatures of the wafer chuck below may be characterized by the temperatures of the semiconductor devices on the wafer chuck. The first actual temperature distribution of the wafer chuck when the temperature of the wafer chuck reaches the first set temperature may be obtained according to the obtained actual temperatures of the B semiconductor devices. FIG. 5 shows the first actual temperature distribution of the wafer chuck when the temperature of the wafer chuck reaches the first set temperature in an embodiment. The regions with the same temperature are represented by a same letter or the regions where the temperature fluctuation range is less than or equal to 0.02° C. are represented by the same letter.

At S404, a second actual temperature distribution of the wafer chuck is obtained according to the actual temperatures of the C semiconductor devices.

Figure 6:
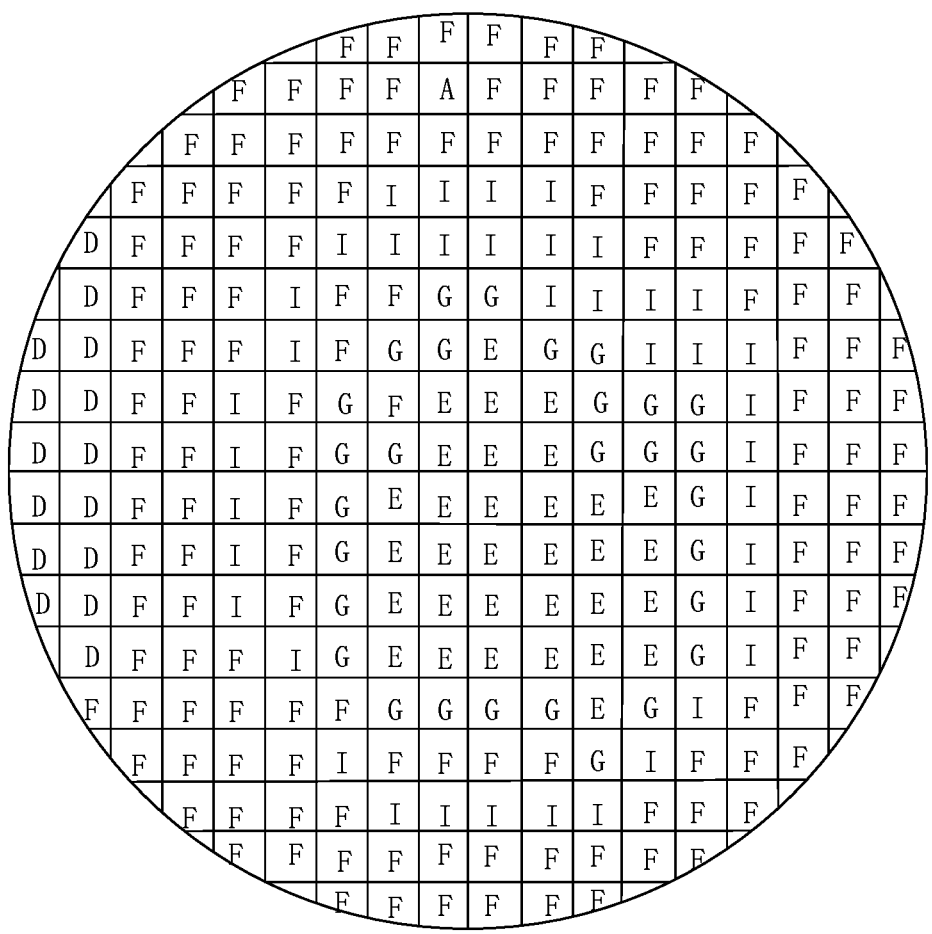
FIG. 6 shows a second actual temperature distribution of a wafer chuck when the temperature of the wafer chuck reaches a second set temperature according to an embodiment.

Since the semiconductor devices on the wafer chuck are in direct contact with the wafer chuck below, the temperatures of the wafer chuck below may be characterized by the temperatures of the semiconductor devices on the wafer chuck. The second actual temperature distribution of the wafer chuck when the temperature of the wafer chuck reaches the second set temperature may be obtained according to the obtained actual temperatures of the C semiconductor devices. FIG. 6 shows a second actual temperature distribution of the wafer chuck when the temperature of the wafer chuck reaches the second set temperature in an embodiment. The regions with the same temperature are represented by a same letter or the regions where the temperature fluctuation range is less than or equal to 0.02° C. are represented by the same letter.

In one embodiment, B or/and C are equal to A. Both the first actual temperature distribution of the wafer chuck, obtained in step S402, when the temperature of the wafer chuck reaches the first set temperature and the second actual temperature distribution of the wafer chuck, obtained in step S404, when the temperature of the wafer chuck reaches the second set temperature are the temperature distribution of all positions on the surface of the wafer chuck.

In one embodiment, the B semiconductor devices or/and the C semiconductor devices are semiconductor devices on a central region of the test wafer.

In one embodiment, the B semiconductor devices or/and the C semiconductor devices are uniformly distributed on the test wafer.

In one embodiment, the first group of parameters and/or the second group of parameters includes at least one type of electrical parameter that varies as the function of temperature.

In one embodiment, the first group of parameters and/or the second group of parameters include two or more type of electrical parameters that vary as the function of temperature. After the corresponding actual temperature distributions of a plurality of wafer chucks with different electrical parameters when the temperature of the wafer chucks reaches the set temperatures are obtained in step S110, the actual temperature distribution of one wafer chuck obtained by fitting the actual temperature distributions of the plurality of wafer chucks at the same set temperature serves as the actual temperature distribution of the wafer chuck at the set temperature, thereby reducing the temperature measuring deviation of the wafer chuck.

In one embodiment, before step S104, the method further includes the following operation. A measuring device is provided. The measuring device is provided with a measuring probe. The measuring probe is close to the test wafer.

In one embodiment, before the semiconductor devices are measured, the method further includes the following operations. Position coordinates of each of the semiconductor devices on the test wafer are obtained and the position coordinates are stored in the measuring device. The measuring device adjusts a position of the measuring probe according to the position coordinates, so that the measuring probe can measure electrical parameter of a chip.

Different test wafers have a certain thickness difference. A certain distance exists between the measuring probe and the test wafer before the electrical parameter is measured. That is, the measuring probe has a certain height relative to the test wafer. The initial position and height of the measuring probe are adjusted, so that the measuring probe can be in effective contact with test regions on semiconductor devices needed to be measured in the subsequent measurement operations, and electrical parameter of the semiconductor device is obtained.

In one embodiment, measuring probes of different materials have different deformations with temperatures, and the sizes of the semiconductor devices on the test wafer also have changes of different degrees with temperatures. The initial position and height of the measuring probe are adjusted to match the set temperatures of the wafer chuck before the electrical parameter is measured, so that the measuring probe can be in effective contact with test regions on semiconductor devices needed to be measured in the subsequent measurement operations, and electrical parameter of the semiconductor device is obtained.

In one embodiment, after step S104, the method includes the following operation.

The measurement of the electrical parameter starts to be performed after the temperature of the wafer chuck is kept for an interval time t, so that the temperature of the wafer chuck is in a stable state or the change of the electrical parameter of the semiconductor device is small, and test data of electrical parameter with small deviation is obtained.

In one embodiment, the interval time t is greater than or equal to 0.5 h.

In one embodiment, step S106 includes the following operation. The measuring probe keeps for a period of time after moving to the surface of the test wafer, so that after the temperature of the measuring probe reaches the temperature of the wafer chuck, the measurement of the electrical parameter starts to be performed.

In one embodiment, the temperature of the wafer chuck returns to the set temperature of the wafer chuck in an idle state after step S110.

The above method for measuring a temperature of a wafer chuck includes the following operations. A heat source is provided. The wafer chuck is disposed on the heat source, a test wafer is placed on the wafer chuck, and a plurality of semiconductor devices having electrical parameters varying as a function of temperature are formed on the test wafer. The heat source is controlled to make the temperature of the wafer chuck reach set temperatures. The semiconductor devices are measured respectively to obtain electrical parameters corresponding to the semiconductor devices. Actual temperatures of the semiconductor devices are obtained according to the electrical parameters and variations, of the electrical parameters, as the function of temperature. An actual temperature distribution of the wafer chuck is obtained according to the actual temperatures of the semiconductor devices. The set temperatures are greater than or equal to a minimum critical temperature endurable by the semiconductor devices and smaller than or equal to a maximum critical temperature endurable by the semiconductor devices. According to this solution, a test wafer which the semiconductor devices have electrical parameters varying as a function of temperature are formed on is placed on a wafer chuck. The semiconductor devices are measured respectively, and the electrical parameters corresponding to the semiconductor devices are obtained. The electrical parameters corresponding to the semiconductor devices when the temperature of the wafer chuck reaches the set temperatures are measured. Actual temperatures of the semiconductor devices are obtained according to the electrical parameters and the variations, of the electrical parameters, as the function of temperature, and an actual temperature distribution of the wafer chuck is further obtained, so that the influence of the surrounding environment on a measurement temperature of the wafer chuck is eliminated, and the temperature measuring deviation of the wafer chuck is reduced.

In one embodiment, a method for calibrating a temperature of a wafer chuck is provided. The method includes operations for measuring the temperature of the wafer chuck. The temperature of the wafer chuck is measured by using the above any one of methods for measuring the temperature of the wafer chuck. The method for calibrating the temperature further includes the following operations.

A heat source is adjusted according to an actual temperature distribution of the wafer chuck, so that when the temperature of the wafer chuck reaches the set temperatures, actual temperatures of semiconductor devices tend to the set temperatures.

In one embodiment, the wafer chucks include a wafer chuck carrying an 8-inch wafer and a wafer chuck carrying a 12-inch wafer.

The above method for calibrating a temperature of a wafer chuck includes operations for measuring the temperature of the wafer chuck. The temperature of the wafer chuck is measured by using the above any one of methods for measuring the temperature of the wafer chuck. The method for calibrating temperature further includes the following operations. A heat source is adjusted according to an actual temperature distribution of the wafer chuck, so that when the temperature of the wafer chuck reaches set temperatures, actual temperatures of semiconductor devices tend to the set temperatures. According to this solution, a test wafer which a plurality of semiconductor devices have electrical parameters varying as a function of temperature are formed on is placed on the wafer chuck. The semiconductor devices are measured respectively. The electrical parameters corresponding to the semiconductor devices are obtained. The electrical parameters corresponding to the semiconductor devices when the temperature of the wafer chuck reaches the set temperatures are measured. Actual temperatures of the semiconductor devices are obtained according to the electrical parameters and variations, of the electrical parameters, as the function of temperature, and an actual temperature distribution of the wafer chuck is further obtained. The influence of the surrounding environment on a measurement temperature of the wafer chuck is eliminated, and the temperature measuring deviation of the wafer chuck is reduced. A heat source is adjusted according to an actual temperature distribution of the wafer chuck, so that when the temperature of the wafer chuck reaches set temperatures, actual temperatures of semiconductor devices tend to the set temperatures. The deviations between the obtained actual temperatures of the test positions of the semiconductor devices on the wafer chuck and the set temperature are reduced, and the accuracy of wafer chuck temperature calibration is improved.

Figure 7:
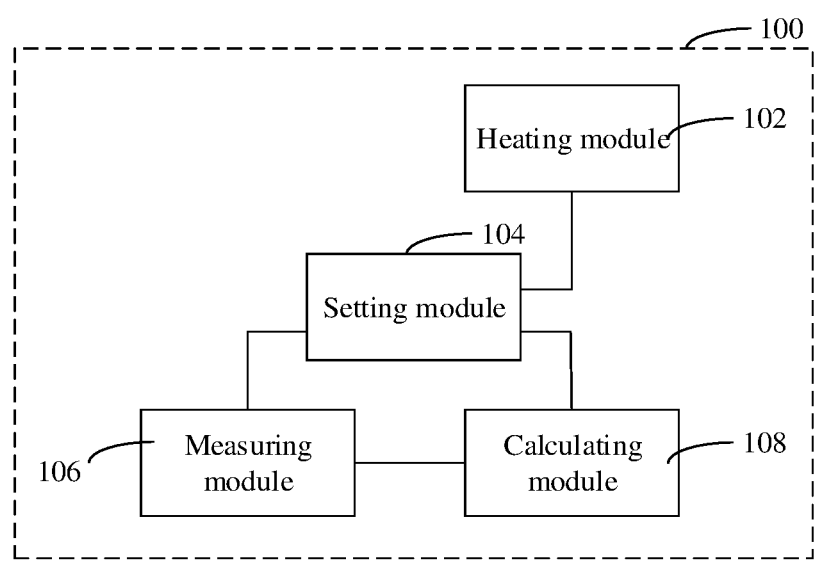
FIG. 7 is a structural block diagram of a temperature measuring system according to an embodiment.

As shown in FIG. 7, in one embodiment, a temperature measuring system 100 for measuring the temperature of a wafer chuck is provided. The temperature measuring system includes: a heating module 102, a setting module 104, a measuring module 106, and a calculating module 108.

The heating module 102 is configured to heat the wafer chuck to set temperatures. A test wafer is placed on the wafer chuck. A plurality of semiconductor devices having electrical parameters varying as a function of temperature are formed on the test wafer.

Specifically, after obtaining the set temperatures of the wafer chuck, the heating module 102 heats the temperature of the wafer chuck to the corresponding set temperatures.

In one embodiment, the semiconductor devices include at least one type of the following: a bipolar junction transistor device, a resistor device, and a field effect transistor device.

In one embodiment, each of the semiconductor devices includes one or more type of electrical parameters that varies as a function of temperature within a temperature range (e.g., −150° C. to 150° C., −100° C. to 100° C.), such as a resistance parameter and a voltage parameter.

In one embodiment, the size of the wafer chuck is related to the size of a wafer carried by the wafer chuck. For example, the wafer chuck is a wafer chuck carrying an 8-inch wafer or a wafer chuck carrying a 12-inch wafer.

The setting module 104 is configured to set the set temperatures of the wafer chuck. The set temperatures are greater than or equal to a minimum critical temperature endurable by the semiconductor devices and smaller than or equal to a maximum critical temperature endurable by the semiconductor devices.

The measuring module 106 is configured to measure the semiconductor devices on the test wafer respectively to obtain electrical parameters of the semiconductor devices.

In one embodiment, the measuring module 106 is further configured to obtain position coordinates of each of the semiconductor devices on the test wafer, and store the position coordinates in the measuring device. The measuring device includes a measuring probe. The measuring module is further configured to adjust a position of the measuring probe according to the position coordinates.

The calculating module 108 is configured to obtain variations, of the electrical parameters, as the function of temperature and the electrical parameters of the semiconductor devices corresponding to the set temperatures, calculate to obtain actual temperatures of the semiconductor devices corresponding to the set temperatures, and obtain an actual temperature distribution of the wafer chuck according to the actual temperatures of the semiconductor devices.

In one embodiment, the set temperatures include a first set temperature and a second set temperature. The setting module 104 is further configured to set B semiconductor devices on the test wafer as semiconductor devices corresponding to the first set temperature and set C semiconductor devices on the test wafer as semiconductor devices corresponding to the second set temperature. The measuring module 106 is further configured to measure electrical parameters of the B semiconductor devices on the test wafer at the first set temperature respectively to obtain a first group of parameters. The measuring module 106 is further configured to measure electrical parameters of the C semiconductor devices on the test wafer at the second set temperature respectively to obtain a second group of parameters. The calculating module 108 is further configured to obtain actual temperatures corresponding to the B semiconductor devices and the C semiconductor devices respectively according to the obtained first group of parameters and second group of parameters and the variations, of the electrical parameters, as the function of temperature, and obtain a first actual temperature distribution of the wafer chuck at the first set temperature and a second actual temperature distribution of the wafer chuck at the second set temperature according to the actual temperatures corresponding to the B semiconductor devices and the C semiconductor devices. The test wafer is provided with A semiconductor devices. A is an integer greater than or equal to 2. Both B and C are integers greater than or equal to 2 and smaller than or equal to A.

In one embodiment, the set temperatures of the wafer chuck set by the setting module 104 are set to, for example, −40° C., −20° C., 0° C., 10° C., 25° C., 50° C., 85° C., 100° C., 125° C., and 150° C., etc., according to the requirement.

In one embodiment, the C semiconductor devices include at least one semiconductor device belonging to the B semiconductor devices.

In one embodiment, the C semiconductor devices are composed of a group of semiconductor devices, different from the B semiconductor devices, on the test wafer.

In one embodiment, the B semiconductor devices or/and the C semiconductor devices are semiconductor devices of a central region of the test wafer.

In one embodiment, the B semiconductor devices or/and the C semiconductor devices are uniformly distributed on the test wafer.

The above temperature measuring system for measuring the temperature of a wafer chuck includes a heating module 102, a setting module 104, a measuring module 106, and a calculating module 108. The heating module is configured to heat the wafer chuck to set temperatures. A test wafer is placed on the wafer chuck. A plurality of semiconductor devices having electrical parameters varying as a function of temperature are formed on the test wafer. The setting module is configured to set the set temperatures of the wafer chuck. The measuring module is configured to measure the semiconductor devices on the test wafer respectively to obtain electrical parameters of the semiconductor devices. The calculating module is configured to obtain variations, of the electrical parameters, as the function of temperature and the electrical parameters of the semiconductor devices corresponding to the set temperatures, calculate to obtain actual temperatures of the semiconductor devices corresponding to the set temperatures, and obtain an actual temperature distribution of the wafer chuck according to the actual temperatures of the semiconductor devices. The set temperatures are greater than or equal to a minimum critical temperature endurable by the semiconductor devices and smaller than or equal to a maximum critical temperature endurable by the semiconductor devices. According to this solution, after the heating module heats a wafer chuck which a test wafer is placed on to set temperatures, the measuring module measures the semiconductor devices on the test wafer respectively to obtain electrical parameters of the semiconductor devices, and the calculating module obtains the variations, of the electrical parameters, as the function of temperature and the electrical parameters of the semiconductor devices corresponding to the set temperatures, calculate to obtain actual temperatures of the semiconductor devices corresponding to the set temperatures, and obtain an actual temperature distribution of the wafer chuck according to the actual temperatures of the semiconductor devices. The semiconductor devices having electrical parameters varying as a function of temperature are formed on the test wafer. The influence of the surrounding environment on a measurement temperature of the wafer chuck is eliminated, and the temperature measuring deviation of the wafer chuck is reduced.

It should be noted that the term "module" in the present disclosure may be a hardware component or a software unit.

The technical features of the above embodiments may be combined arbitrarily. In order to simplify the description, all possible combinations of the technical features in the above embodiments are not completely described. However, as long as there is no conflict between these technical features, they should be considered to be within the scope of this specification.

The above embodiments merely describe a few implementations of the present disclosure, and the descriptions are specific and detailed, but cannot therefore be construed to limit the patent scope of the present disclosure. It should be noted that those of ordinary skill in the art may further make several variations and improvements without departing from the conception of the present disclosure, which fall within the protection scope of the present disclosure. Therefore, the patent protection scope of the present disclosure should be subject to the appended claims.

The invention claimed is:

1. A method for measuring a temperature of a wafer chuck, comprising:
   providing a heat source, wherein the wafer chuck is disposed on the heat source, a test wafer is placed on the wafer chuck, and a plurality of semiconductor devices having electrical parameters varying as a function of temperature are formed on the test wafer;
   controlling the heat source to make the temperature of the wafer chuck reach set temperatures;
   measuring the semiconductor devices respectively to obtain electrical parameters corresponding to the semiconductor devices;
   obtaining actual temperatures of the semiconductor devices according to the electrical parameters and variations, of the electrical parameters, as the function of temperature; and
   obtaining an actual temperature distribution of the wafer chuck according to the actual temperatures of the semiconductor devices, wherein the actual temperatures of the semiconductor devices are same as actual temperatures of wafer chuck regions below the semiconductor devices respectively,
   wherein the set temperatures are greater than or equal to a minimum critical temperature endurable by the semiconductor devices and smaller than or equal to a maximum critical temperature endurable by the semiconductor devices,
   wherein the set temperatures comprise a first set temperature and a second set temperature,
   wherein measuring the semiconductor devices respectively to obtain the electrical parameters corresponding to the semiconductor devices comprises:
      measuring electrical parameters of B number of semiconductor devices on the test wafer at the first set temperature respectively to obtain a first group of parameters; and
      measuring electrical parameters of C number of semiconductor devices on the test wafer at the second set temperature respectively to obtain a second group of parameters,
   wherein obtaining the actual temperatures of the semiconductor devices according to the electrical parameters and the variations, of the electrical parameters, as the function of temperature comprises:
      obtaining actual temperatures corresponding to the B number of semiconductor devices according to the first group of parameters; and
      obtaining actual temperatures corresponding to the C number of semiconductor devices according to the second group of parameters,
   wherein obtaining the actual temperature distribution of the wafer chuck according to the actual temperatures of the semiconductor devices comprises:
      obtaining a first actual temperature distribution of the wafer chuck according to the actual temperatures of the B number of semiconductor devices; and
      obtaining a second actual temperature distribution of the wafer chuck according to the actual temperatures of the C number of semiconductor devices, and
   wherein the test wafer is provided with A number of semiconductor devices, A is an integer greater than or equal to 2, and both B and C are integers greater than or equal to 2 and smaller than or equal to A.

2. The method of claim 1, wherein each of the semiconductor devices comprises one or more electrical parameters that vary as the function of temperature.

3. A method for calibrating the temperature of the wafer chuck, comprising: measuring the temperature of the wafer chuck, wherein measuring the temperature of the wafer chuck is implemented according to the method for measuring the temperature of the wafer chuck of claim 2, and the method for calibrating the temperature further comprises:
   adjusting the heat source according to the actual temperature distribution of the wafer chuck, so that when the temperature of the wafer chuck reaches the set temperatures, the actual temperatures of semiconductor devices tend to the set temperatures.

4. The method of claim 1, wherein at least one of the first group of parameters or the second group of parameters comprises at least one type of electrical parameter that varies as the function of temperature.

5. A method for calibrating the temperature of the wafer chuck, comprising: measuring the temperature of the wafer chuck, wherein measuring the temperature of the wafer chuck is implemented according to the method for measuring the temperature of the wafer chuck of claim 4, and the method for calibrating the temperature further comprises:
   adjusting the heat source according to the actual temperature distribution of the wafer chuck, so that when the temperature of the wafer chuck reaches the set temperatures, the actual temperatures of semiconductor devices tend to the set temperatures.

6. The method of claim 1, wherein at least one of the B number of semiconductor devices or the C number of semiconductor devices are semiconductor devices on a central region of the test wafer.

7. A method for calibrating the temperature of the wafer chuck, comprising: measuring the temperature of the wafer chuck, wherein measuring the temperature of the wafer chuck is implemented according to the method for measuring the temperature of the wafer chuck of claim 6, and the method for calibrating the temperature further comprises:
adjusting the heat source according to the actual temperature distribution of the wafer chuck, so that when the temperature of the wafer chuck reaches the set temperatures, the actual temperatures of semiconductor devices tend to the set temperatures.

8. The method of claim 1, wherein before controlling the heat source to make the temperature of the wafer chuck reach the set temperatures, the method further comprises:
providing a measuring device, wherein the measuring device is provided with a measuring probe, and the measuring probe is close to the test wafer and is configured to measure the semiconductor devices to obtain the electrical parameters of the semiconductor devices.

9. A method for calibrating a temperature of a wafer chuck, comprising: measuring the temperature of the wafer chuck, wherein measuring the temperature of the wafer chuck is implemented according to the method for measuring the temperature of the wafer chuck of claim 8, and the method for calibrating the temperature further comprises:
adjusting the heat source according to the actual temperature distribution of the wafer chuck, so that when the temperature of the wafer chuck reaches the set temperatures, the actual temperatures of semiconductor devices tend to the set temperatures.

10. The method of claim 8, wherein before measuring the semiconductor devices, the method further comprises:
obtaining position coordinates of each of the semiconductor devices on the test wafer, and storing the position coordinates in the measuring device, wherein the measuring device adjusts a position of the measuring probe according to the position coordinates.

11. A method for calibrating the temperature of the wafer chuck, comprising: measuring the temperature of the wafer chuck, wherein measuring the temperature of the wafer chuck is implemented according to the method for measuring the temperature of the wafer chuck of claim 10, and the method for calibrating the temperature further comprises:
adjusting the heat source according to the actual temperature distribution of the wafer chuck, so that when the temperature of the wafer chuck reaches the set temperatures, the actual temperatures of semiconductor devices tend to the set temperatures.

12. The method of claim 1, wherein the semiconductor devices comprise at least one type of the following: a bipolar junction transistor device, a resistor device, or a field effect transistor device.

13. A method for calibrating the temperature of the wafer chuck, comprising: measuring the temperature of the wafer chuck, wherein measuring the temperature of the wafer chuck is implemented according to the method for measuring the temperature of the wafer chuck of claim 12, and the method for calibrating the temperature further comprises:
adjusting the heat source according to the actual temperature distribution of the wafer chuck, so that when the temperature of the wafer chuck reaches the set temperatures, the actual temperatures of semiconductor devices tend to the set temperatures.

14. A method for calibrating the temperature of the wafer chuck, comprising: measuring the temperature of the wafer chuck, wherein measuring the temperature of the wafer chuck is implemented according to the method for measuring the temperature of the wafer chuck of claim 1, and the method for calibrating the temperature further comprises:
adjusting the heat source according to the actual temperature distribution of the wafer chuck, so that when the temperature of the wafer chuck reaches the set temperatures, the actual temperatures of semiconductor devices tend to the set temperatures.

15. A temperature measuring system for measuring a temperature of a wafer chuck, comprising:
a heating component, configured to heat the wafer chuck to set temperatures, wherein a test wafer is placed on the wafer chuck, and a plurality of semiconductor devices having electrical parameters varying as a function of temperature are formed on the test wafer;
a setting component, configured to set the set temperatures of the wafer chuck;
a measuring component, configured to measure the semiconductor devices on the test wafer respectively to obtain electrical parameters of the semiconductor devices; and
a calculating component, configured to obtain variations, of the electrical parameters, as the function of temperature and the electrical parameters of the semiconductor devices corresponding to the set temperatures, calculate to obtain actual temperatures of the semiconductor devices corresponding to the set temperatures, and obtain an actual temperature distribution of the wafer chuck according to the actual temperatures of the semiconductor devices, wherein the actual temperatures of the semiconductor devices are same as actual temperatures of wafer chuck regions below the semiconductor devices respectively,
wherein the set temperatures are greater than or equal to a minimum critical temperature endurable by the semiconductor devices and smaller than or equal to a maximum critical temperature endurable by the semiconductor devices,
wherein the set temperatures comprise a first set temperature and a second set temperature,
wherein the setting component is further configured to set B number of semiconductor devices on the test wafer as semiconductor devices corresponding to the first set temperature and set C number of semiconductor devices on the test wafer as semiconductor devices corresponding to the second set temperature,
wherein the measuring component is further configured to measure electrical parameters of the B number of semiconductor devices on the test wafer at the first set temperature respectively to obtain a first group of parameters,
wherein the measuring component is further configured to measure electrical parameters of the C number of semiconductor devices on the test wafer at the second set temperature respectively to obtain a second group of parameters,
wherein the calculating component is further configured to obtain actual temperatures corresponding to the B number of semiconductor devices according to the first group of parameters and the variations, of the electrical parameters, as the function of temperature, obtain actual temperatures corresponding to the C number of semiconductor devices according to the second group of parameters and the variations, of the electrical parameters, as the function of temperature, obtain a first actual temperature distribution of the wafer chuck according to the actual temperatures of the B number of semiconductor devices; and obtain a second actual temperature distribution of the wafer chuck according to the actual temperatures of the C number of semiconductor devices, and wherein the test wafer is provided with A number of semiconductor devices, A is an integer greater than or equal to 2, and both B and C are integers greater than or equal to 2 and smaller than or equal to A.

16. The temperature measuring system of claim 15, wherein the measuring component is further configured to obtain position coordinates of each of the semiconductor devices on the test wafer, and store the position coordinates in the measuring device, wherein the measuring device comprises a measuring probe, and the measuring component is further configured to adjust a position of the measuring probe according to the position coordinates, wherein the measuring probe is configured to measure the semiconductor devices to obtain the electrical parameters of the semiconductor devices.

17. The temperature measuring system of claim 15, wherein the semiconductor devices comprise at least one type of the following: a bipolar junction transistor device, a resistor device, and a field effect transistor device.

* * * * *